United States Patent
Huang et al.

(10) Patent No.: US 11,300,586 B2
(45) Date of Patent: Apr. 12, 2022

(54) PROBE HEAD AND CONDUCTIVE PROBE THEREOF

(71) Applicant: Premtek International Inc., Hsinchu (TW)

(72) Inventors: YaJu Huang, Hsinchu (TW); Horng-Chieh Wang, Hsinchu (TW)

(73) Assignee: Premtek International Inc., Hsinchu (TW)

( * ) Notice: Subject to any disclaimer, the term of this patent is extended or adjusted under 35 U.S.C. 154(b) by 131 days.

(21) Appl. No.: 16/562,445

(22) Filed: Sep. 6, 2019

(65) Prior Publication Data

US 2021/0003611 A1    Jan. 7, 2021

(30) Foreign Application Priority Data

Jul. 1, 2019  (TW) .................................. 108123100

(51) Int. Cl.
  *G01R 1/067*  (2006.01)
  *G01R 1/073*  (2006.01)
  *G01R 31/28*  (2006.01)

(52) U.S. Cl.
  CPC ..... *G01R 1/06738* (2013.01); *G01R 31/2886* (2013.01)

(58) Field of Classification Search
  CPC .... G01R 1/067; G01R 1/073; G01R 1/06733; G01R 1/06716; G01R 1/06738; G01R 1/06744; G01R 1/06772; G01R 1/06755; G01R 1/07314; G01R 1/07357; G01R 1/07371; G01R 1/07342; G01R 1/07378; G01R 1/07307
  See application file for complete search history.

(56) References Cited

U.S. PATENT DOCUMENTS

| | | | |
|---|---|---|---|
| 2017/0307657 A1* | 10/2017 | Crippa | G01R 1/06761 |
| 2019/0317131 A1* | 10/2019 | Hsieh | G01R 1/07357 |
| 2020/0292576 A1* | 9/2020 | Perego | H01R 13/2435 |
| 2020/0379009 A1* | 12/2020 | Morgana | G01R 1/06755 |

FOREIGN PATENT DOCUMENTS

| | | |
|---|---|---|
| TW | 201546457 A | 12/2015 |
| TW | I639836 B | 11/2018 |
| TW | I641840 B | 11/2018 |

* cited by examiner

*Primary Examiner* — Neel D Shah

(74) *Attorney, Agent, or Firm* — Li & Cai Intellectual Property Office

(57) ABSTRACT

A probe head and a conductive probe thereof are provided. The conductive probe has a first long lateral edge and a second long lateral edge which define a central axis therebetween. The conductive probe includes a middle segment, an upper connecting segment and a lower connecting segment respectively extending from the middle segment in two opposite directions, and an upper contacting segment and a lower contacting segment respectively extending from the upper and the lower connecting segments in two opposite directions. The lower contacting segment includes a testing tip having an offset with respect to the central axis and a curved surface connecting the testing tip and the second long lateral edge. A first distance between the testing tip and the first long lateral edge is less than a second distance between the testing tip and the second long lateral edge.

7 Claims, 7 Drawing Sheets

PROBE HEAD AND CONDUCTIVE PROBE THEREOF

CROSS-REFERENCE TO RELATED PATENT APPLICATION

This application claims the benefit of priority to Taiwan Patent Application No. 108123100, filed on Jul. 1, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe, and more particularly to a probe head and a conductive probe thereof.

BACKGROUND OF THE DISCLOSURE

A conventional probe head includes a plurality of conductive probes. One end of each of the conductive probes is abutted against a space transformer, and the other end of each of the conductive probes is configured to test an integrated circuit (IC) component under test. However, after many years of improvements to the conventional probe head, it is now difficult for the structure of the conventional probe head to undergo any dramatic changes, and the structure of the conductive probe in the conventional probe head is also limited by a conventional structure (e.g., a testing tip of the conventional conductive probe being arranged at a center position and is formed only by planes).

SUMMARY OF THE DISCLOSURE

In response to the above-referenced technical inadequacies, the present disclosure provides a probe head and a conductive probe thereof to effectively improve the issues associated with conventional conductive probes.

In one aspect, the present disclosure provides a probe head for an integrated circuit (IC) test. The probe head includes an upper die unit, a lower die unit that is spaced apart from the upper die unit, and a plurality of conductive probes each having two ends. One of the two ends of each of the conductive probes passes through the upper die unit, and the other one of the two ends of each of the conductive probes passes through passes through the lower die unit. Each of the conductive probes has a first long lateral edge and a second long lateral edge that is opposite to the first long lateral edge, and the first long lateral edge and the second long lateral edge of each of the conductive probes define a central axis there-between. Each of the conductive probes includes a middle segment, an upper connecting segment, a lower connecting segment, an upper contacting segment, and a lower contacting segment. The middle segment is arranged between the upper die unit and the lower die unit. The upper connecting segment and the lower connecting segment respectively extend from two opposite ends of the middle segment in two opposite directions parallel to the central axis. The upper connecting segment is arranged in the upper die unit, and the lower connecting segment is arranged in the lower die unit. The upper contacting segment extends from the upper connecting segment in a direction away from the middle segment along the central axis to protrude from the upper die unit, and the upper contacting segment is configured to contact a space transformer. The lower contacting segment extends from the lower connecting segment in a direction away from the middle segment along the central axis to protrude from the lower die unit. The lower contacting segment is configured to contact an IC component under test. The lower contacting segment includes a testing tip having an offset with respect to the central axis and a curved surface that connects the testing tip and the second long lateral edge, and a distance between the testing tip and the first long lateral edge is less than a second distance between the testing tip and the second long lateral edge.

In one aspect, the present disclosure provides a conductive probe of a probe head. The conductive probe includes a first long lateral edge and a second long lateral edge that is opposite to the first long lateral edge. The first long lateral edge and the second long lateral edge define a central axis there-between. The conductive probe includes a middle segment, an upper connecting segment, a lower connecting segment, an upper contacting segment, and a lower contacting segment. The upper connecting segment and the lower connecting segment respectively extend from two opposite ends of the middle segment in two opposite directions parallel to the central axis. The upper contacting segment extends from the upper connecting segment in a direction away from the middle segment along the central axis. The upper contacting segment is configured to contact a space transformer. The lower contacting segment extends from the lower connecting segment in a direction away from the middle segment along the central axis. The lower contacting segment is configured to contact an integrated circuit (IC) component under test. The lower contacting segment includes a testing tip having an offset with respect to the central axis and a curved surface that connects the testing tip and the second long lateral edge, and a distance between the testing tip and the first long lateral edge is less than a second distance between the testing tip and the second long lateral edge.

Therefore, the conductive probe of the probe head in the present disclosure is formed with an offset testing tip on the lower contacting segment, and the testing tip is connected to the curved surface, so that the testing tip of the conductive probe can be supported by the curved surface to provide a better supporting effect.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
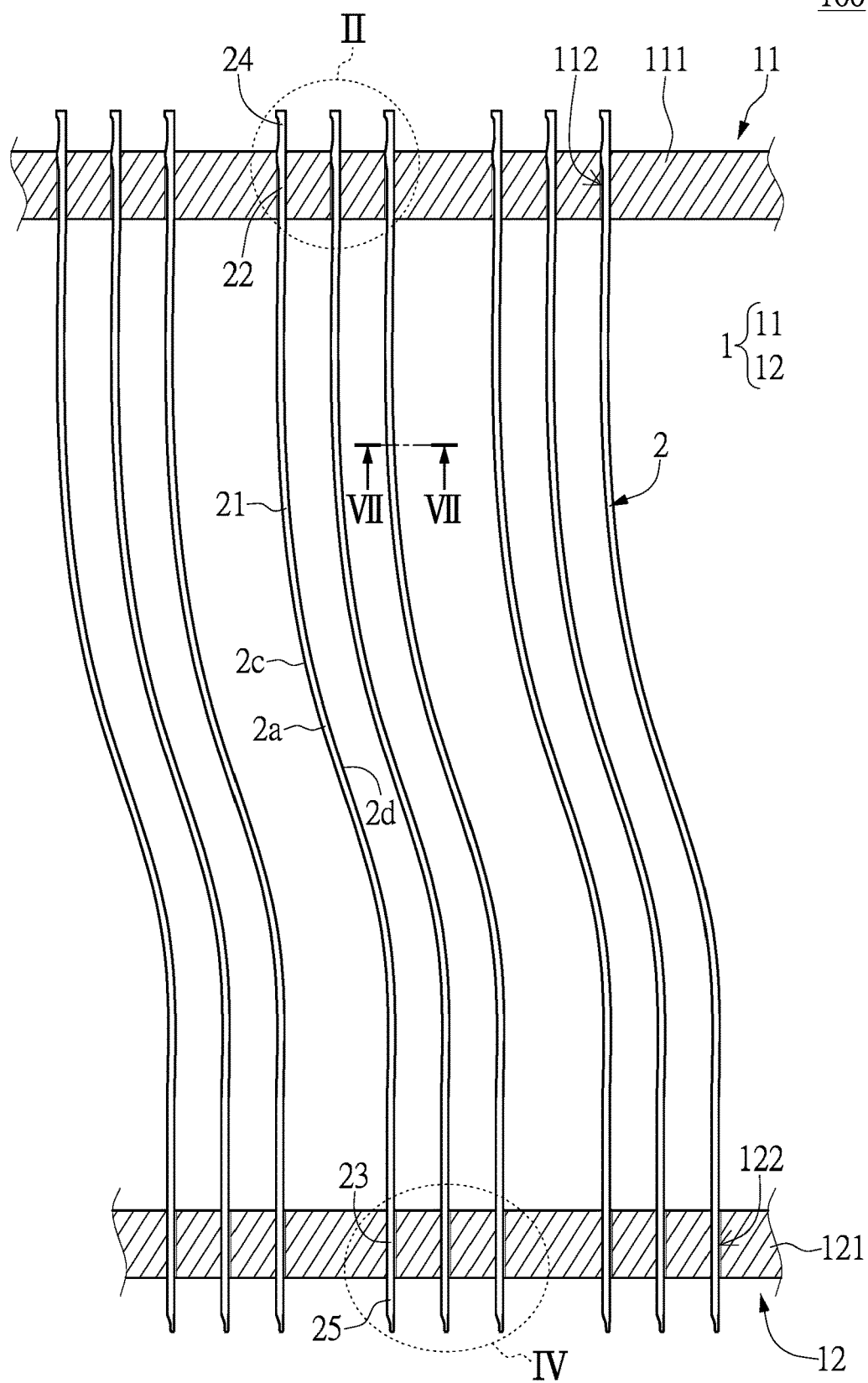
FIG. 1 is a cross-sectional view of a probe head according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 10, an embodiment of the present disclosure provides a probe head 100 for an integrated circuit (IC) test. In other words, as shown in FIG. 1, the probe head 100 is configured to test an IC component under test (e.g., a semiconductor wafer). The probe head 100 includes a retainer 1 and a plurality of conductive probes 2 passing through and positioned in the retainer 1. Two ends of each of the conductive probes 2 respectively pass through the retainer 1, one of the two ends (e.g., a top end shown in FIG. 1) of each of the conductive probes 2 is configured to fix to and electrically connect to a space transformer (not shown), and the other one of the two ends (e.g., a bottom end shown in FIG. 1) of each of the conductive probes 2 is configured to abut against and test the IC component (not shown).

It should be noted that the conductive probes 2 in the present embodiment are in cooperation with the retainer 1, but the present disclosure is not limited thereto. For example, in other embodiments of the present disclosure, the conductive probe 2 can be independently used (e.g., sold) or can be used in cooperation with other components. Moreover, in order to clearly describe the structure and connection relationship of each component of the probe head 100, the drawings of the present embodiment only show a portion of the probe head 100. The following description describes the structure and connection relationship of each of the retainer 1 and the conductive probes 2.

The retainer 1 includes an upper die unit 11, a lower die unit 12 spaced apart from the upper die unit 11, and a spacing unit (not shown) that is sandwiched between the upper die unit 11 and the lower die unit 12. In other words, the upper die unit 11 and the lower die unit 12 in the present embodiment are spaced apart from each other through the spacing unit. Specifically, the spacing unit can be an annular spacing board, but the specific structure of the spacing unit can be adjusted or changed according to design requirements.

Moreover, since the upper die unit 11 and the lower die unit 12 in the present embodiment are in a staggered arrangement along a transverse direction, two portions of each of the conductive probes 2 are respectively pressed by the upper die unit 11 and the lower die unit 12 so as to deform a middle portion of each of the conductive probes 2. Accordingly, each of the conductive probes 2 can be positioned by the upper die unit 11 and the lower die unit 12.

Specifically, in the present embodiment, the upper die unit 11 is a single die 111 having a plurality of upper thru-holes 112, and the lower die unit 12 is also a single die 121 having a plurality of lower thru-holes 122. The lower thru-holes 122 of the lower die unit 12 respectively correspond in position to the upper thru-holes 112 of the upper die unit 11, so that each of the upper thru-holes 112 and the corresponding lower thru-hole 122 can be provided for an insertion of one of the conductive probes 2.

In addition, in other embodiments of the present disclosure, at least one of the upper die unit 11 and the lower die unit 12 can include two dies and a spacing pad sandwiched between the two dies, and can be configured to position any one of the conductive probes 2 by the two dies in a staggered arrangement.

As shown in FIG. 1, one of the two ends of each of the conductive probes 2 passes through the corresponding upper thru-hole 112 of the upper die unit 11, and the other one of the two ends of each of the conductive probes 2 passes through the corresponding lower thru-hole 122 of the lower die unit 12. As the conductive probes 2 are of the same structure, the following description discloses the structure of just one of the conductive probes 2 and the corresponding upper and lower thru holes 112, 122 for the sake of brevity, but the present disclosure is not limited thereto. For example, in other embodiments of the present disclosure, the conductive probes 2 of the probe head 100 can have a different structure.

Figure 7:
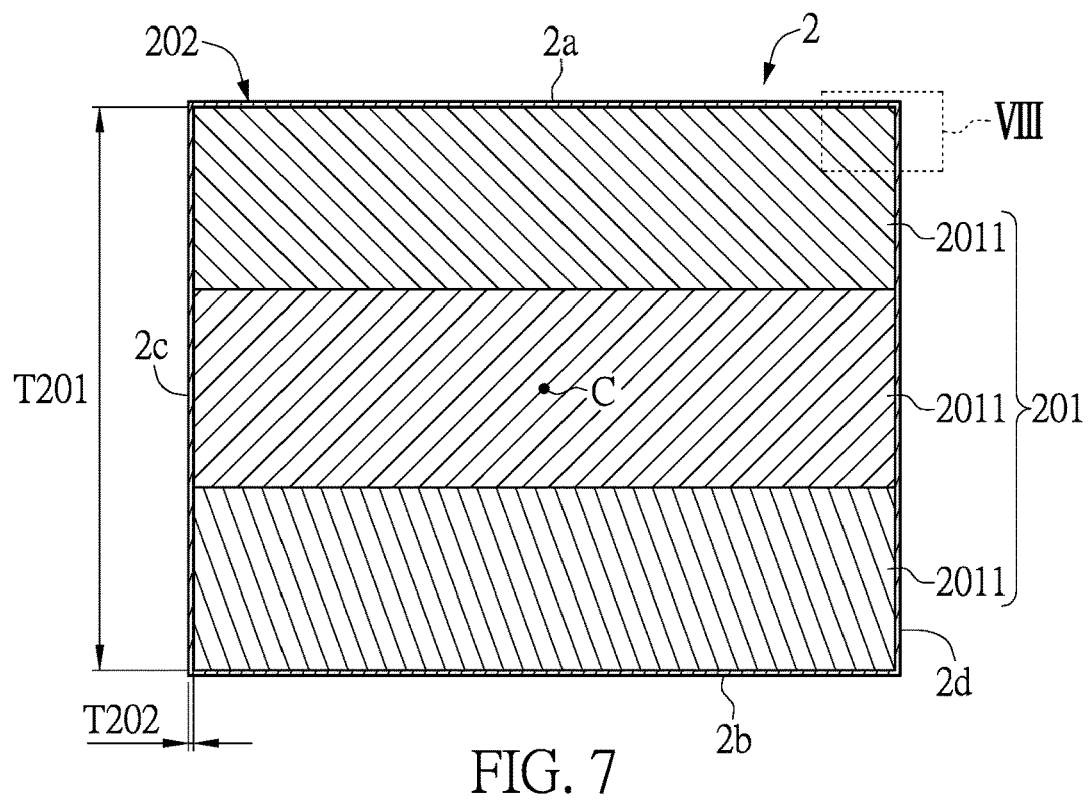
FIG. 7 is a cross-sectional view taken along line VII-VII of FIG. 1.
Figure 8:
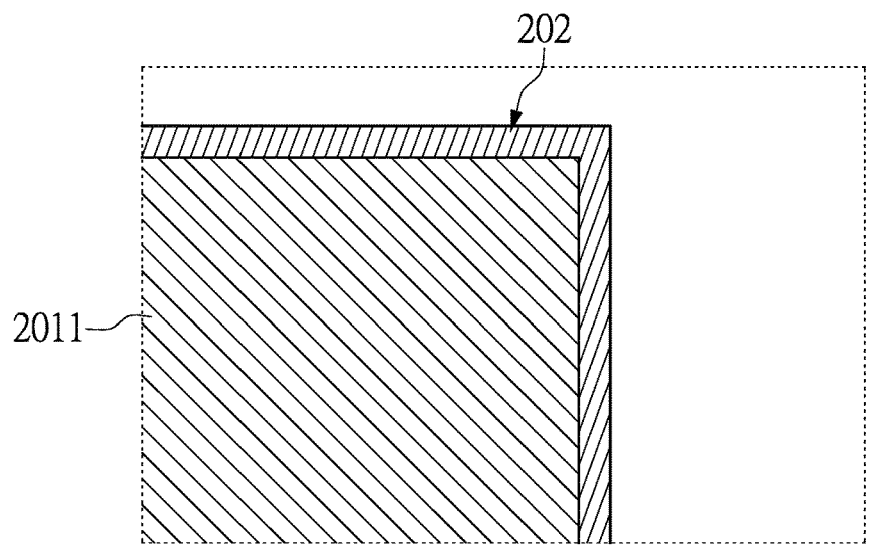
FIG. 8 is an enlarged view showing portion VIII of FIG. 7.

As shown in FIG. 1 and FIG. 7, the conductive probe 2 includes a first long lateral edge 2a, a second long lateral edge 2b that is opposite to the first long lateral edge 2a, a first long lateral surface 2c, and a second long lateral surface 2d that is opposite to the first long lateral surface 2c. In other words, a cross section of the conductive probe 2 in the present embodiment is a substantially rectangular shape, and the first long lateral edge 2a, the second long lateral edge 2b, the first long lateral surface 2c, and the second long lateral surface 2d of the conductive probe 2 are provided to be shaped as a rectangular tube, but the present disclosure is not limited thereto.

Moreover, for clearly describing the structure of the conductive probe 2 of the present embodiment, the conductive probe 2 defines a central axis C parallel to a longitudinal direction thereof and arranged between the first long lateral edge 2a and the second long lateral edge 2b (or between the first long lateral surface 2c and the second long lateral surface 2d). In other words, the central axis C is located among the first long lateral edge 2a, the second long lateral edge 2b, the first long lateral surface 2c, and the second long lateral surface 2d. Moreover, a distance between the central axis C and the first long lateral edge 2a is equal to that between the central axis C and the second long lateral edge 2b, and a distance between the central axis C and the first long lateral surface 2c is equal to that between the central axis C and the second long lateral surface 2d.

Figure 2:
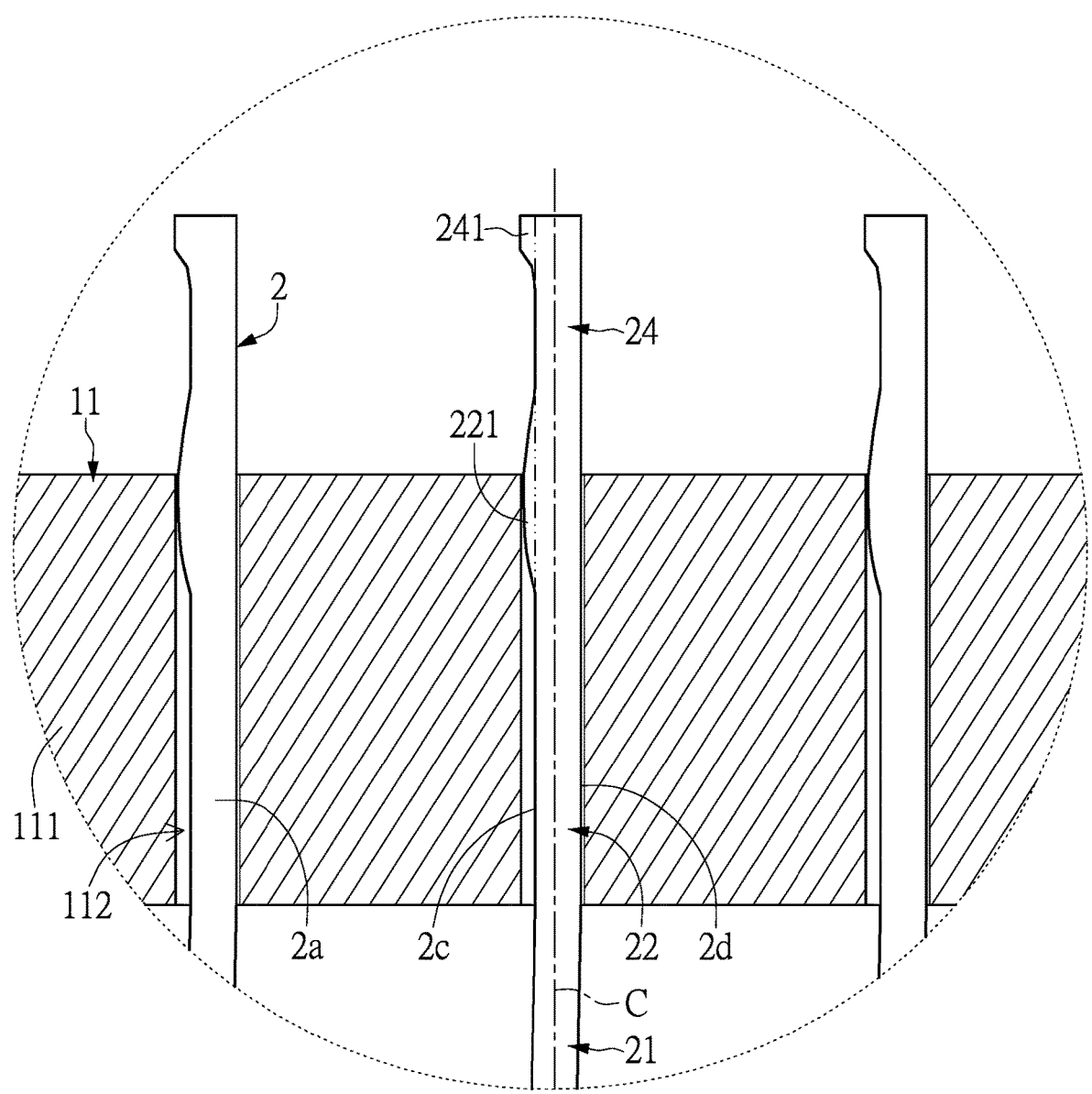
FIG. 2 is an enlarged view showing portion II of FIG. 1.

As shown in FIG. 1 and FIG. 2, the conductive probe 2 includes a middle segment 21, an upper connecting segment 22 and a lower connecting segment 23 which respectively extend from two opposite ends of the middle segment 21 in two opposite directions parallel to the central axis C, an upper contacting segment 24 extending from the upper connecting segment 22 in a direction away from the middle segment 21 along the central axis C, and a lower contacting segment 25 extending from the lower connecting segment 23 in a direction away from the middle segment 21 along the central axis C. In other words, the conductive probe 2 sequentially includes the middle segment 21, the upper connecting segment 22, the lower connecting segment 23, the upper contacting segment 24, and the lower contacting segment 25.

The middle segment 21 is arranged between the upper die unit 11 and the lower die unit 21, the upper connecting segment 22 is arranged in the corresponding upper thru-hole 112 of the upper die unit 11, and the lower connecting segment 23 is arranged in the corresponding lower thru-hole 122 of the lower die unit 12. The upper contacting segment 24 extends from the upper connecting segment 22 to protrude from the upper die unit 11, and is configured to contact the space transformer. The lower contacting segment 25 extends from the lower connecting segment 23 to protrude from the lower die unit 12, and is configured to contact the IC component under test.

Specifically, as shown in FIG. 2, the upper connecting segment 22 includes an extension 221 extending from the first long lateral surface 2c in a direction away from the central axis C, the upper contacting segment 24 includes a protrusion 241 extending from the first long lateral surface 2c in a direction away from the central axis C, and the extension 221 and the protrusion 241 are spaced apart from each other. In other words, any elongated protrusion formed on any probe is not identical to the extension 221 and the protrusion 241 of the present embodiment, and any two protrusions respectively formed on two different surfaces of any probe are not identical to the extension 221 and the protrusion 241 of the present embodiment.

It should be noted that any one of the conductive probes 2 of the present embodiment is provided without any structure extending from the second long lateral surface. In other words, the conductive probe 2 has at least two protrusions on the first long lateral surface 2c (i.e., the extension 221 and the protrusion 241), and the second long lateral surface 2d of the conductive probe 2 is a flat surface or is formed with at least one recess, but the present disclosure is not limited thereto. For example, in other embodiments of the present disclosure, the conductive probe 2 can be formed with at least one protrusion on the second long lateral surface 2d.

Moreover, the extension 221 is arranged on a portion of the upper connecting segment 22 (e.g., a top portion of the upper connecting segment 22 shown in FIG. 2) distant from the middle segment 21, so that the portion of the upper connecting segment 22 having the extension 221 is wider than the other portion of the upper connecting segment 22. Accordingly, a distance between the portion of the upper connecting segment 22 having the extension 221 and an inner wall defining the corresponding upper thru-hole 112 is less than a distance between the other portion of the upper connecting segment 22 without having the extension 221 and the inner wall. That is to say, the central axis C of the conductive probe 2 is not located at a center of the corresponding upper thru-hole 112.

Figure 3:
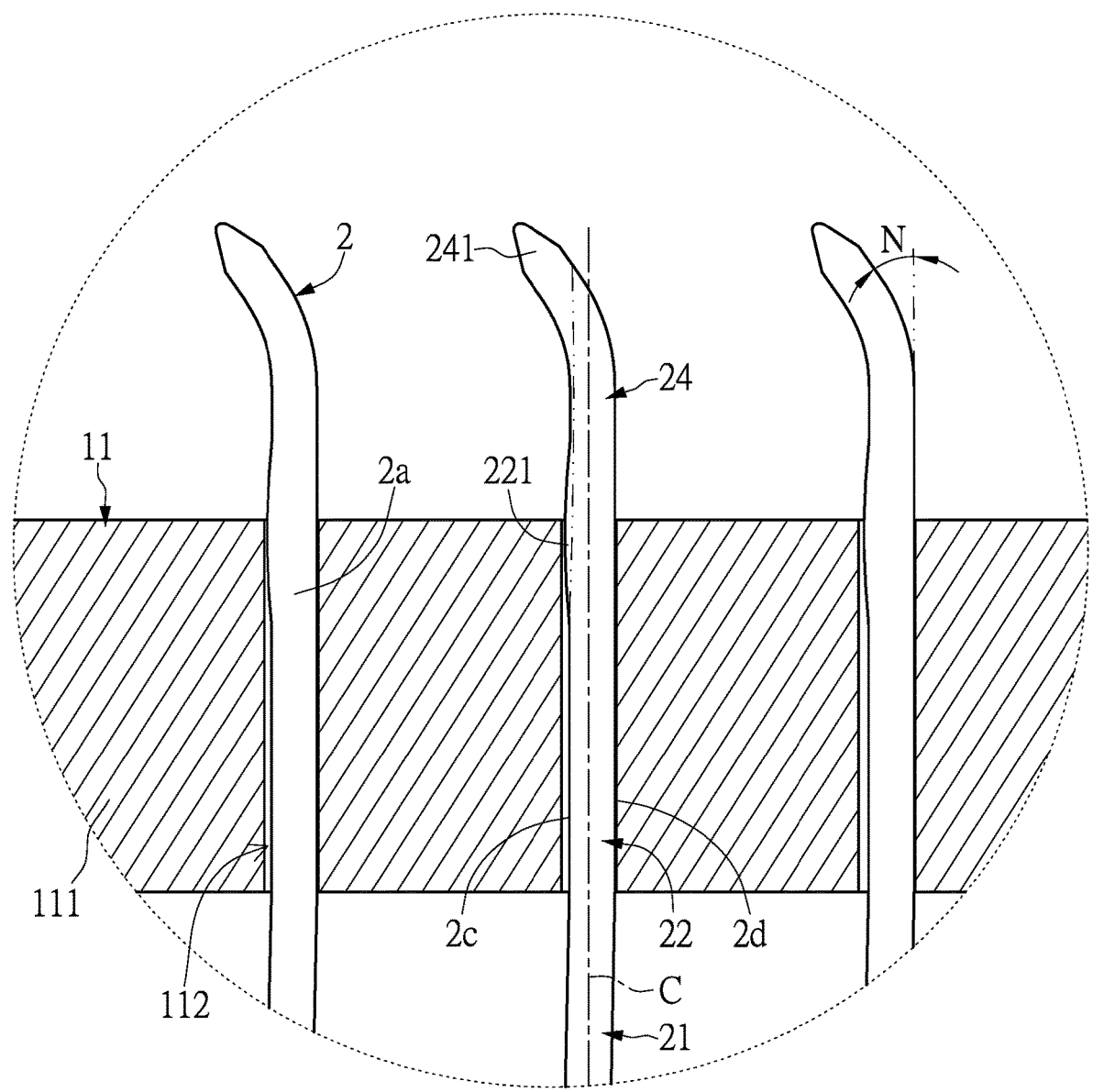
FIG. 3 is an enlarged view showing portion II of FIG. 1 in another configuration.

The protrusion 241 is arranged on an end portion of the upper contacting segment 24, and is configured to contact and fix onto the space transformer. Moreover, the structure of any one of the protrusion 241 and the extension 221 can be changed or adjusted according to design requirements, and is not limited to the structure shown in FIG. 2. For example, as shown in FIG. 3, the upper contacting segment 24 has a notch N recessed from a portion of the second long lateral surface 2d corresponding in position to the protrusion 241, and the notch N has an angle within a range of 1-80 degrees (e.g., the range of 15-45 degrees is preferable). In addition, a distance between the protrusion 241 and the central axis C is greater than a distance between the extension 221 and the central axis C, is greater than 50% of a diameter of the upper thru-hole 112.

In summary, the conductive probe 2 of the present embodiment is formed with the extension 221 and the protrusion 241 on the same side (e.g., the first long lateral surface 2c) thereof, so that the upper contacting segment 24 can be firmly connected to the space transformer through the protrusion 241, and the portion of the upper connecting segment 22 having the extension 221 and the inner wall defining the corresponding thru-hole 112 can have a smaller gap there-between, thereby effectively controlling the relative position between the central axis C of the conductive probe 2 and the upper die unit 11.

Figure 4:
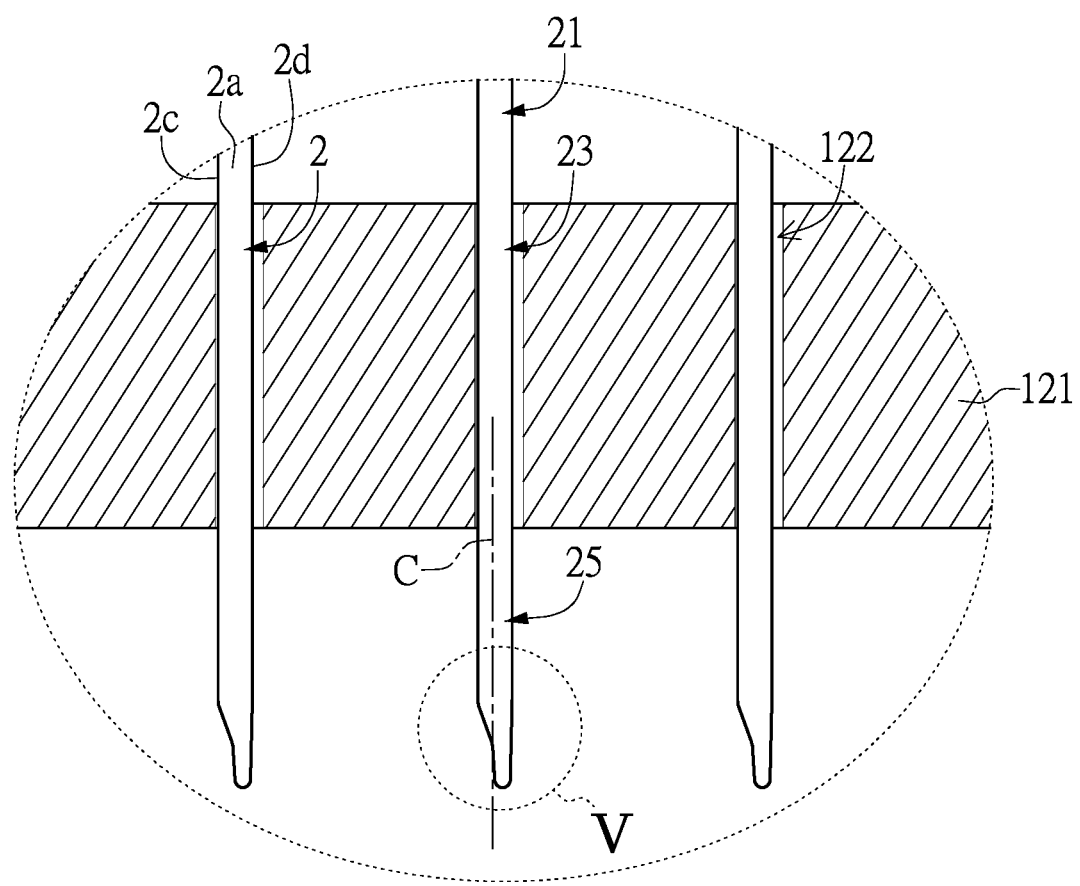
FIG. 4 is an enlarged view showing portion IV of FIG. 1.
Figure 5:
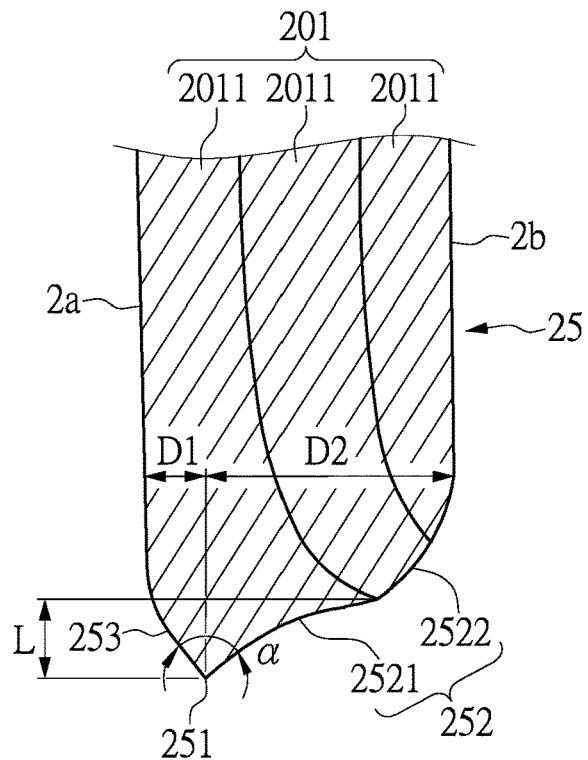
FIG. 5 is a cross-sectional view taken along line V-V of FIG. 4 when a metal film is omitted.
Figure 6:
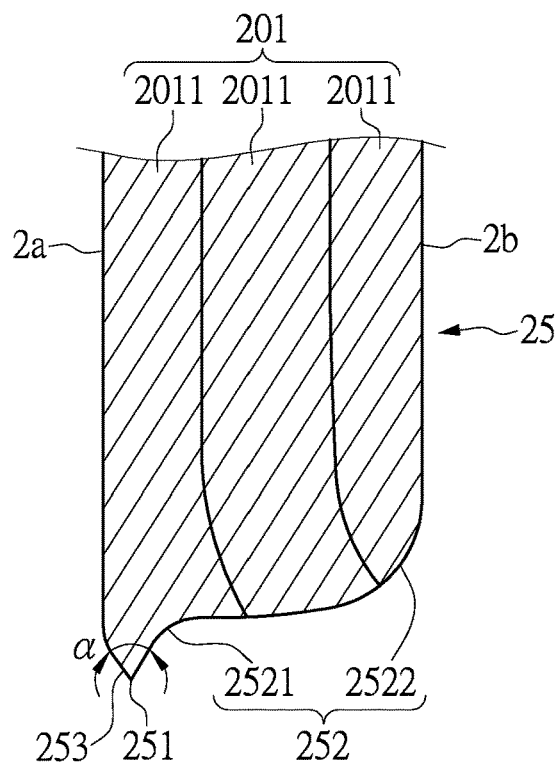
FIG. 6 is a cross-sectional view showing another configuration of FIG. 5 when a metal film is omitted.

As shown in FIG. 4 and FIG. 5, the lower contacting segment 25 includes a testing tip 251 having an offset with respect to the central axis C and a curved surface 252 connected to a side of the testing tip 251 and the second long lateral edge 2b. In other words, any probe provided with a plane to connect a testing tip and an adjacent long edge is different from the conductive probe 2 of the present embodiment.

It should be noted that the present embodiment is illustrated by FIG. 5 to show the testing tip 251 and the curved surface 252 of the conductive probe 2, and FIG. 5 shows a longitudinal cross section that includes the testing tip 251 and that is perpendicular to the first long lateral edge 2a. In the present embodiment, the cross-sectional view is also perpendicular to the second long lateral edge 2b, and is parallel to the first long lateral surface 2c and the second long lateral surface 2d. In the cross-sectional view (i.e., FIG. 5), the lower contacting segment 25 has an angle α at the testing tip 251, and the angle α is within a range of 30-150 degrees (e.g., the range of 45-120 degrees is preferable), but the present disclosure is not limited thereto.

Specifically, a distance D1 between the testing tip 251 and the first long lateral edge 2a is less than a second distance D2 between the testing tip 251 and the second long lateral edge 2b, and a ratio of the first distance D1 to the second distance D2 is greater than or equal to zero and is less than one. In the present embodiment, the first distance D1 can be within a range of 0-40 μm, and when the first distance D1 is not zero, the conductive probe 2 has a curved lateral surface 253 connecting the testing tip 251 and the first long lateral edge 2a, but the present disclosure is not limited thereto. Accordingly, the conductive probe 2 of the present embodiment is formed with the curved surface 252 (and the curved lateral surface 253) to support the testing tip 251, thereby providing a better supporting effect.

Moreover, the curved surface 252 in the present embodiment includes a first curved portion 2521 connected to the testing tip 251 and a second curved portion 2522 connected to the second long lateral edge 2b, and the first curved portion 2521 is curved in a direction opposite to a direction in which the second curved portion 2522 is curved. Specifically, as shown in FIG. 5, a center of curvature of the first curved portion 2521 is located above the testing tip 251, and a center of curvature of the second curved portion 2522 is located under the testing tip 251, but the present disclosure is not limited thereto. For example, in other embodiments of the present disclosure, the first curved portion 2521 and the second curved portion 2522 can be curved in the same direction, that is to say, the center of curvature of the first curved portion 2521 and the center of curvature of the second curved portion 2522 are located at the same side of the testing tip 251.

In addition, the testing tip 251 in the present embodiment has a puncturing length L that is measured from a junction of the first curved portion 2521 and the second curved portion 2522 by a distance within a range of 3-15 μm, so that the testing tip 251 of the conductive probe 2 can be effectively supported by the curved surface 252, but the present disclosure is not limited thereto.

It should be noted that the upper contacting segment 24 and the lower contacting segment 25 of the conductive probe 2 in the present embodiment are formed according to different requirements, so that the upper contacting segment 24 and the lower contacting segment 25 cannot be interchangeably used. That is to say, a portion of any probe used for contacting a space transformer is different from the lower contacting segment 25 of the conductive probe 2 of the present embodiment. In addition, the structure of the lower contacting segment 25 in the present embodiment can be adjusted or changed according to design requirements, and is not limited to the structure shown in FIG. 5. For example, the lower contacting segment 25 can be formed as the structure shown in FIG. 6.

As shown in FIG. 7, the conductive probe 2 of the present embodiment can be described from another perspective. Specifically, the conductive probe 2 includes a metal pin 201 and a metal film 202 that covers (or is formed on) the entirety of an outer surface of the metal pin 201. That is to say, the metal pin 201 and the metal film 202 jointly construct the conductive probe 2. Moreover, a thickness T202 of the metal film 202 is less than 10% of a thickness T201 of the metal pin 201, and the thickness T202 of the metal film 202 in the present embodiment is within a range of 0.1-5 μm, but the present disclosure is not limited thereto. In other words, if a thickness of a metal film of any probe is greater than 10% of a thickness of a metal pin thereof, said probe should be considered as being different from the conductive probe 2 of the present embodiment.

Accordingly, the conductive probe 2 in the present embodiment is formed with the thin metal film 202 to cover the entirety of the outer surface of the metal pin 201, so that the damage or oxidation of the metal pin 201 can be effectively avoided to improve the stability of the conductive probe 2 under a premise that a thickness of the conductive probe 2 is not greatly increased.

Specifically, as shown in FIG. 7, the metal pin includes a plurality of pin bodies 2011 stacked in one direction, and each of the pin bodies 2011 is an elongated shape parallel to the central axis C. In the present embodiment, if the metal film 202 is not considered, the first long lateral edge 2a and the second long lateral edge 2b of the conductive probe 2 are respectively defined by two of the pin bodies 2011 that are arranged at the outermost side, and each of the first long lateral surface 2c and the second long lateral surface 2d is defined by the pin bodies 2011, but the present disclosure is not limited thereto. For example, in other embodiments of the present disclosure, each of the first long lateral edge 2a and the second long lateral edge 2b can be defined by the pin bodies 2011, and the first long lateral surface 2c and the second long lateral surface 2d can be respectively defined by two of the pin bodies 2011 that are arranged at the outermost side.

Moreover, the testing tip 251 of the conductive probe 2 is formed on one of the pin bodies 2011 (shown in FIG. 5), and the pin bodies 2011 jointly form the extension 221 and the protrusion 241 (shown in FIG. 2 and FIG. 7), but the present disclosure is not limited thereto. For example, in other embodiments of the present disclosure, the testing tip 251 of the conductive probe 2 can be formed by the pin bodies 2011, and any one of the extension 221 and the protrusion 241 can be formed by one of the pin bodies 2011.

In addition, the junction of the first curved portion 2521 and the second curved portion 2522 in the present embodiment is located at a junction of two of the pin bodies 2011 (shown in FIG. 5). That is to say, the first curved portion 2521 and the second curved portion 2522 of the conductive probe 2 in the present embodiment are respectively formed by two of the pin bodies 2011, thereby increasing the forming precision of each of the first curved portion 2521 and the second curved portion 2522.

Specifically, as shown in FIG. 7, the number of the pin bodies 2011 of the conductive probe 2 in the present embodiment is three, and the material and properties of any one of the pin bodies 2011 can be different from those of another one of the pin bodies 2011 (e.g., one of the pin bodies 2011 having the testing tip 251 has a hardness that is larger than a hardness of another one of the pin bodies 2011, thereby increasing the durability of the conductive probe 2), but the present disclosure is not limited thereto. For example, in other embodiments of the present disclosure, the conductive probe 2 can include two pin bodies 2011 or at least four pin bodies 2011, or the material and properties of the pin bodies 2011 are the same.

Figure 9:
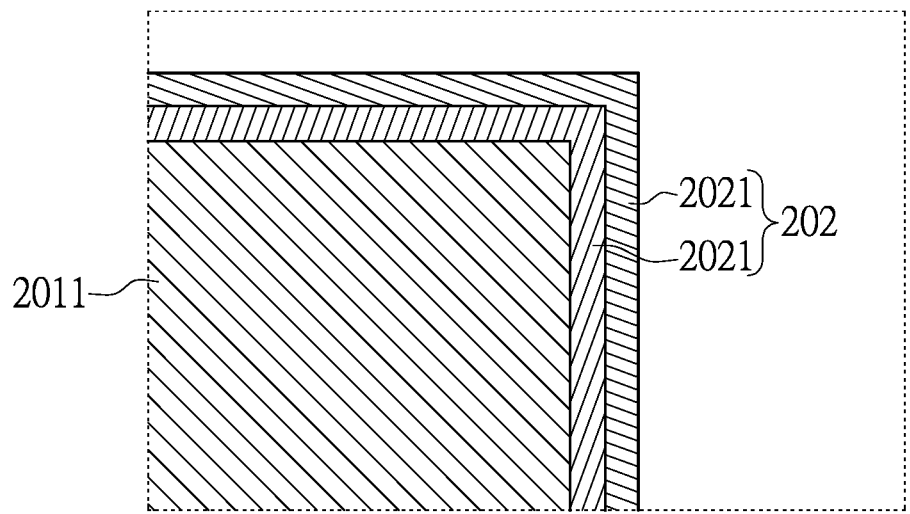
FIG. 9 is an enlarged view showing portion VIII of FIG. 7 in another configuration.
Figure 10:
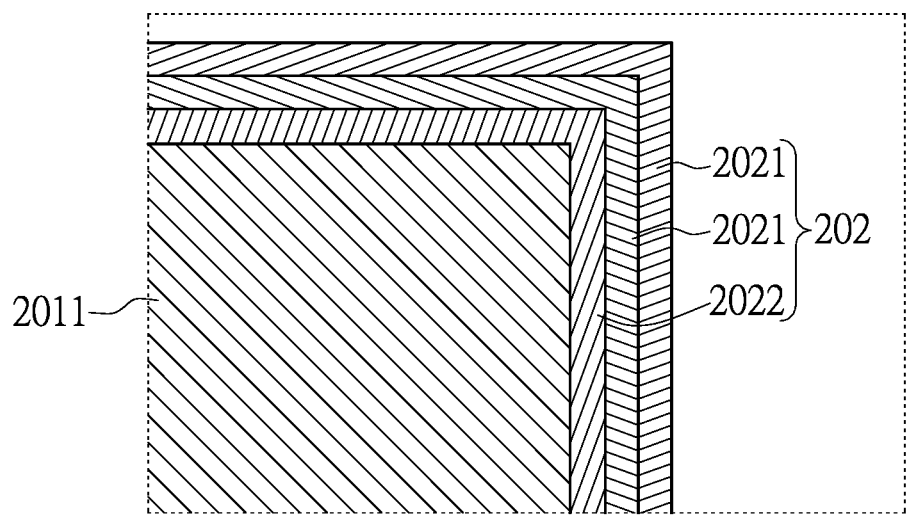
FIG. 10 is an enlarged view showing portion VIII of FIG. 7 in still another configuration.

If the thickness T202 of the metal film 202 is less than 10% of the thickness T201 of the metal pin 201, the structure of the metal film 202 can be adjusted or changed according to design requirements. For example, the metal film 202 in the present embodiment can be a single layer shown in FIG. 7 or FIG. 8, or can be a multi-layer shown in FIG. 9 or FIG. 10. As shown in FIG. 9 and FIG. 10, the metal film 202 includes N number of metal layers 2021 sequentially stacked and arranged outside of the metal pin 201, and N is a positive integer greater than one. Specifically, as shown in FIG. 9, N is two, and one of the two metal layers 2021 covers (or is formed on) the entirety of the outer surface of the metal pin 201. As shown in FIG. 10, the metal film 202 further includes a combining layer 2022 that connects the outer surface of the metal pin 201 and the N number of the metal layers 2021.

In conclusion, the conductive probe of the probe head in the present disclosure is formed with an offset testing tip on the lower contacting segment, and the testing tip is connected to the curved surface (and the curved lateral surface), so that the testing tip of the conductive probe can be supported by the curved surface (and the curved lateral surface) to provide a better supporting effect.

Moreover, the conductive probe of the probe head in the present disclosure is formed with an extension and a protrusion formed on the same side (e.g., the first long lateral surface) of the upper connecting segment and the upper contacting segment, so that the upper contacting segment can be firmly connected to the space transformer through the protrusion, and the portion of the upper connecting segment having the extension and the upper die unit (e.g., the inner wall defining the corresponding thru-hole) can have a smaller gap there-between, effectively controlling the relative position between the central axis of the conductive probe and the upper die unit.

In addition, the conductive probe in the present disclosure is formed with a thin metal film to cover the entirety of the outer surface of the metal pin, so that the damage or oxidation of the metal pin can be effectively avoided to improve the stability of the conductive probe under a premise that a thickness of the conductive probe is not greatly increased.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe head for an integrated circuit (IC) test, comprising:
   an upper die unit and a lower die unit that is spaced apart from the upper die unit; and
   a plurality of conductive probes each having two ends, wherein one of the two ends of each of the conductive probes passes through the upper die unit, and the other one of the two ends of each of the conductive probes passes through the lower die unit, wherein each of the conductive probes has a first long lateral edge and a second long lateral edge that is opposite to the first long lateral edge, and the first long lateral edge and the second long lateral edge of each of the conductive probes define a central axis there-between, and wherein each of the conductive probes includes:
   a middle segment arranged between the upper die unit and the lower die unit;
   an upper connecting segment and a lower connecting segment which respectively extend from two opposite ends of the middle segment in two opposite directions parallel to the central axis, wherein the upper connecting segment is arranged in the upper die unit, and the lower connecting segment is arranged in the lower die unit, and wherein the upper connecting segment includes an extension extending from the first long lateral surface in a direction away from the central axis;
   an upper contacting segment extending from the upper connecting segment in a direction away from the middle segment along the central axis to protrude from the upper die unit, wherein the upper contacting segment is configured to contact a space transformer; and
   a lower contacting segment extending from the lower connecting segment in a direction away from the middle segment along the central axis to protrude from the lower die unit, wherein the lower contacting segment is configured to contact an IC component under test, wherein the lower contacting segment includes a testing tip having an offset with respect to the central axis, a curved surface that connects the testing tip and the second long lateral edge, and a curved lateral surface that connects the testing tip and the first long lateral edge, and wherein the curved surface and the curved lateral surface are connected to each other so as to jointly define the testing tip that is located at a junction of the curved surface and the curved lateral surface, and a distance between the testing tip and the first long lateral edge is less than a second distance between the testing tip and the second long lateral edge;
   wherein any one of the conductive probes includes:
   a metal pin including a plurality of pin bodies stacked in one direction, wherein each of the pin bodies is an elongated shape parallel to the central axis, each of the first long lateral surface and the second long lateral surface is defined by the pin bodies, the pin bodies jointly form the extension, and the testing tip is formed on one of the pin bodies; and
   a metal film covering the entirety of an outer surface of the metal pin, wherein a thickness of the metal film is less than 10% of a thickness of the metal pin;
   wherein in any one of the conductive probes, the curved surface includes a first curved portion connected to the testing tip and a second curved portion connected to the second long lateral edge, the first curved portion of the curved surface is curved in a direction opposite to a direction in which the second curved portion of the curved surface is curved, and the testing tip has a puncturing length that is measured from a junction of the first curved portion and the second curved portion by a distance within a range of 3-15 μm.

2. The probe head according to claim 1, wherein in any one of the conductive probes, a ratio of the first distance to the second distance is greater than or equal to zero and is less than one, and the first distance is within a range of 0-40 μm.

3. The probe head according to claim 1, wherein in a cross section of any one of the conductive probes having the testing tip and perpendicular to the first long lateral edge, the lower contacting segment has an angle at the testing tip, and the angle is within a range of 30-150 degrees.

4. The probe head according to claim 1, wherein any one of the conductive probes includes a first long lateral surface and a second long lateral surface opposite to the first long lateral surface, and the central axis of any one of the conductive probes is arranged between the first long lateral surface and the second long lateral surface, and wherein in any one of the conductive probes, the upper contacting segment includes a protrusion extending from the first long lateral surface in a direction away from the central axis, the pin bodies jointly form the protrusion, and the extension and the protrusion are spaced apart from each other.

5. The probe head according to claim 4, wherein in any one of the conductive probes, the extension is arranged on a portion of the upper connecting segment away from the middle segment, so that the portion of the upper connecting segment having the extension is wider than the other portion of the upper connecting segment, and wherein any one of the conductive probes is provided without any structure extending from the second long lateral surface.

6. The probe head according to claim 1, wherein in any one of the conductive probes, the metal film includes N number of metal layers sequentially stacked and arranged outside of the metal pin, and N is a positive integer greater than one.

7. A conductive probe of a probe head, comprising a first long lateral edge and a second long lateral edge that is opposite to the first long lateral edge, wherein the first long lateral edge and the second long lateral edge define a central axis there-between, and wherein the conductive probe includes:
   a middle segment;
   an upper connecting segment and a lower connecting segment which respectively extend from two opposite ends of the middle segment in two opposite directions parallel to the central axis, wherein the upper connecting segment includes an extension extending from the first long lateral surface in a direction away from the central axis;
   an upper contacting segment extending from the upper connecting segment in a direction away from the middle segment along the central axis, wherein the upper contacting segment is configured to contact a space transformer; and
   a lower contacting segment extending from the lower connecting segment in a direction away from the middle segment along the central axis, wherein the lower contacting segment is configured to contact an integrated circuit (IC) component under test, wherein the lower contacting segment includes a testing tip having an offset with respect to the central axis, a curved surface that connects the testing tip and the second long lateral edge, and a curved lateral surface that connects the testing tip and the first long lateral edge, and wherein the curved surface and the curved lateral surface are connected to each other so as to jointly define the testing tip that is located at a junction of the curved surface and the curved lateral surface, and a distance between the testing tip and the first long lateral edge is less than a second distance between the testing tip and the second long lateral edge;
wherein the conductive probe includes:
a metal pin including a plurality of pin bodies stacked in one direction, wherein each of the pin bodies is an elongated shape parallel to the central axis, each of the first long lateral surface and the second long lateral surface is defined by the pin bodies, the pin bodies jointly form the extension, and the testing tip is formed on one of the pin bodies; and
a metal film covering the entirety of an outer surface of the metal pin, wherein a thickness of the metal film is less than 10% of a thickness of the metal pin;
wherein the curved surface includes a first curved portion connected to the testing tip and a second curved portion connected to the second long lateral edge, the first curved portion of the curved surface is curved in a direction opposite to a direction in which the second curved portion of the curved surface is curved, and the testing tip has a puncturing length that is measured from a junction of the first curved portion and the second curved portion by a distance within a range of 3-15 μm.

* * * * *